United States Patent [19]

Anthony

[11] Patent Number: 4,547,836
[45] Date of Patent: Oct. 15, 1985

[54] INSULATING GLASS BODY WITH ELECTRICAL FEEDTHROUGHS AND METHOD OF PREPARATION

[75] Inventor: Thomas R. Anthony, Schenectady, N.Y.

[73] Assignee: General Electric Company, Schenectady, N.Y.

[21] Appl. No.: 576,085

[22] Filed: Feb. 1, 1984

[51] Int. Cl.⁴ .............................................. H05K 1/18
[52] U.S. Cl. .................................. 361/400; 428/131; 428/901; 428/433; 428/630; 428/596; 428/220; 428/209; 428/210
[58] Field of Search .............. 428/433, 36, 901, 643, 428/644, 630, 629, 586, 596; 361/400

[56] References Cited

U.S. PATENT DOCUMENTS

| | | | |
|---|---|---|---|
| 2,193,640 | 3/1940 | Navias | 428/433 X |
| 2,458,748 | 1/1949 | Stupakoff | 428/433 X |
| 2,520,663 | 8/1950 | Tromp | 428/630 X |
| 3,323,198 | 1/1965 | Shortes | 29/155.5 |
| 3,404,968 | 10/1968 | Rohrer | 428/629 X |
| 3,458,344 | 7/1969 | Little et al. | 428/433 |
| 4,087,589 | 5/1978 | Bessen | 428/596 |
| 4,360,570 | 11/1982 | Andreades et al. | 428/596 |
| 4,396,467 | 8/1983 | Anthony | 204/15 |

Primary Examiner—George F. Lesmes
Assistant Examiner—Nancy A. B. Swisher
Attorney, Agent, or Firm—Leo I. MaLossi; James C. Davis, Jr.; James Magee, Jr.

[57] ABSTRACT

A glass wafer having high aspect ratio holes passing therethrough is provided with metal conductors in the holes as feedthroughs. First, the wafer is processed to line the holes with a thin electron-conducting layer of metal. Next, a layer of the same or different metal is applied over the first metal layer providing the requisite feedthrough electrical conductivity for each hole. Preferably, the glass contains lead oxide, the first metal layer is lead and the next layer is copper.

9 Claims, 4 Drawing Figures

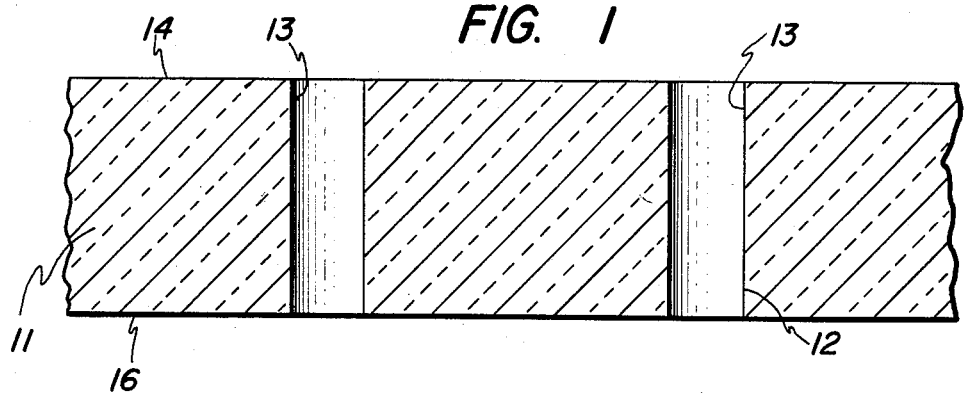
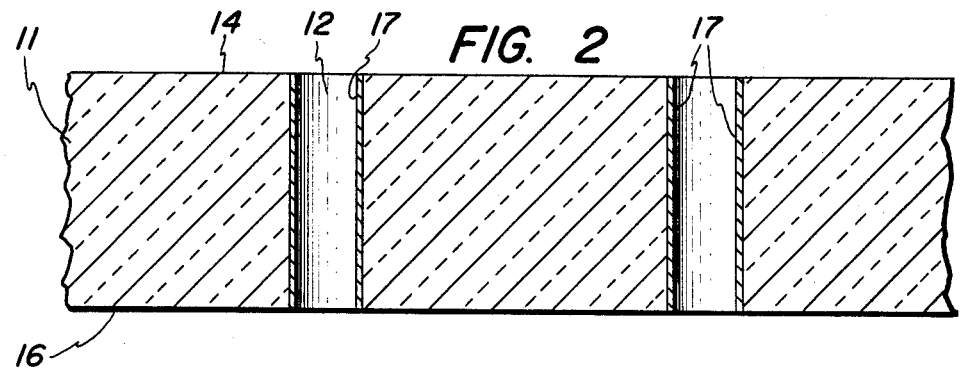
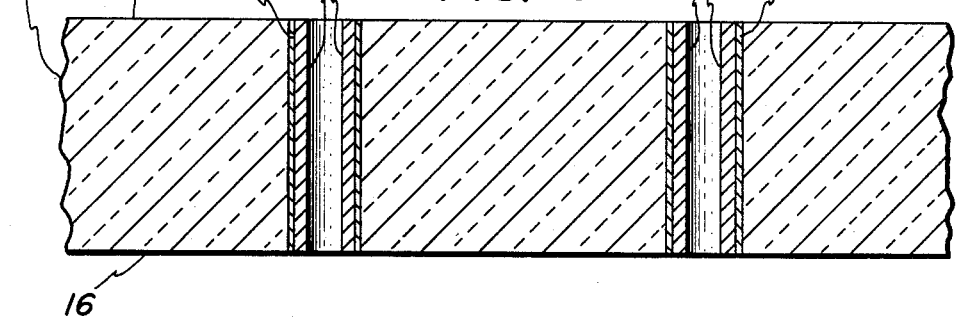
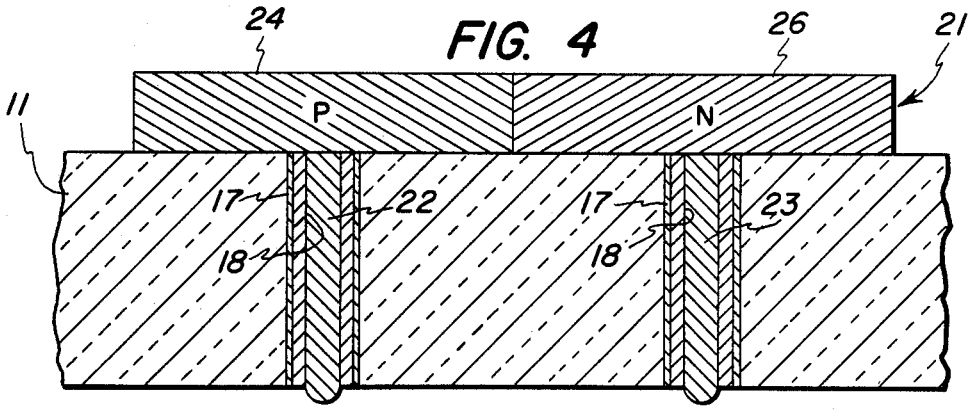

ically insulating" glass means glass having a resistivity at room temperature of about $10^{11}$ ohm-cm. or greater.

INSULATING GLASS BODY WITH ELECTRICAL FEEDTHROUGHS AND METHOD OF PREPARATION

This invention relates to the preparation of insulating bodies having discrete pathways therethrough for the passage of electricity, such devices being of particular use as high frequency stand-off insulators and as part of transparent liquid crystal displays.

This invention is related to inventions disclosed and claimed in the U.S. patent application Ser. No. 204,957 (Ser. No. '957)—Anthony et al, filed Nov. 7, 1980 and U.S. patent application Ser. No. 544,935 (Ser. No. '935) now U.S. Pat. No. 4,437,109—Anthony et al, filed Oct. 24, 1983. The content of these applications is incorporated herein by reference.

U.S. Pat. No. 3,323,198—Shortes, discloses a method for forming electrical interconnections through a substrate of semiconducting material using rapid heating with a beam of high energy electrons producing localized dissociation resulting in the formation of an electrical interconnection passing through the substrate along the hole formed thereby. Whereas the present invention addresses the problem of providing electrical interconnections in the form of high-aspect ratio electrical feedthroughs in a glass body, the Shortes patent is directed to compound semiconductors (Group III-V and Group II-VI compounds) in which one of the elements is highly volatile.

A method employing electroforming for the introduction of through-body electrical interconnects for silicon-on-sapphire and semiconductor bodies is described in U.S. Pat. No. 4,396,467—Anthony.

As used herein the term "insulating" or "electrically insulating" glass means glass having a resistivity at room temperature of about $10^{11}$ ohm-cm. or greater.

DESCRIPTION OF THE INVENTION

A body of electrically insulating glass having opposed, spaced major surfaces (e.g. a glass wafer) is provided with at least one bore extending completely therethrough. Such bore would have an average length-to-diameter ratio of at least 6:1. The glass is to contain at least about 18 weight percent lead oxide with a maximum lead oxide content of about 65 weight percent. By heating the glass body at a temperature of least about 400° C. in a hydrogen atmosphere for a sufficient period of time the inner surface of the bore is converted to a thin metallic film of lead. This is accomplished by reducing the lead oxide within a few tenths of a micron of the surface of the bore to lead atoms, which coalesce into the very thin metallic film on the surface of the glass. This thin film, although it has a high electrical resistance, will conduct electrons. Thereafter, a layer of metal, preferably copper, is applied over the thin film of lead. It is preferred that the entire application of the second layer of metal be accomplished by electroplating. As an alternative, initially, some of the second metal can be applied as a thin layer by electroless deposition, but this should be followed by completion of the deposition by electroplating.

After completion of the deposition of the second metal, the resulting insulating glass body having electrical feedthroughs can be used, for example, to provide through electrical connections for semiconducting chips affixed to the surface of the glass body. This is accomplished by anodically bonding the chips to the surface by applying the appropriate voltage and then introducing the composite into a solder dip whereby solder fills the bore to provide front-back through connections from the chip to the opposite side of the glass body.

The diameter of the bore is typically equal to or less than about 10 mils and the center line-to-center line spacing between bores is typically less than or equal to about 2 bore diameters. Bore length equals the thickness of the glass body, which usually will be a value in the range of from about 12 to about 500 mils.

BRIEF DESCRIPTION OF THE DRAWINGS

The features of this invention believed to be novel and unobvious over the prior art are set forth with particularity in the appended claims. The invention itself, however, as the organization, method of operation and objects and advantages thereof may best be understood by reference to the following description taken in conjunction with the accompanying drawing wherein:

FIG. 1 is a view in section showing a glass wafer having a bore extending completely therethrough interconnecting the major surfaces of the wafer;

FIG. 2 is a view of the structure of FIG. 1 wherein the inner surface of the bore has been processed to yield a very thin metal layer of lead covering the inner surface of the bore;

FIG. 3 is a sectional view of the structure shown in FIG. 2 with the second layer of metal applied thereto and FIG. 4 is a sectional view illustrating the utilization of the structure of FIG. 3 as an interconnect to make front-back through connections to a chip mounted thereon.

MANNER AND PROCESS OF MAKING AND USING THE INVENTION

FIG. 1 displays a glass body 11 (e.g. a wafer about 25 mils thick) provided with a pair of high aspect ratio bores 12 extending completely therethrough. The inside surface of each bore 12 is designated as 13 and the top and bottom surfaces of glass body 11 are designated 14 and 16, respectively. In practical devices, there will be a large number of bores 12 arranged in a predetermined array or pattern such that correlation may be readily made between the locations of these bores and the locations at which connections are to be made with chips (e.g. silicon chips) to be mounted thereon. These bores preferably are to have an average diameter of less then about 1.5 mils and an average length-to-diameter ratio of at least about 6:1. Bores 12 can be formed directly in glass plates 11 by laser-drilling utilizing process limitations to be described hereinbelow, or by stacking and fusing thin plates of glass with properly etched surface contours.

The glass employed should have at least about 18 weight percent lead oxide and the typical glass would be a lead-alkali-silicate glass having a composition range of 30–70 weight percent silicon dioxide, 18–65 weight percent lead oxide and 5–20 weight percent sodium oxide (or potassium oxide). For example, a glass composition of 60% lead oxide, 30% silicon dioxide and 10% sodium oxide has the desired high electrical resistivity yet the surface of a body of such glass can be converted to an electrical (not ionic) conductor by heating the body for several hours at 400° C. in hydrogen gas. As a result of this treatment lead oxide is reduced to a depth of about a few tenths of a micron over the surface of the glass body. The lead atoms, which result, coalesce into a very thin metallic film over the surface of the glass including the inside of bores 12.

Since the step of heating in hydrogen produces the thin layer of lead over all exposed surfaces of the glass body, provisions must be made for removing the very thin lead layer from all surfaces except the inner surfaces of the holes. This can be accomplished, after the glass body has been heated in hydrogen, by a affixing the glass body on the vacuum chuck of a photoresist spinner whereby bores 12 are filled with, and the top of the glass body is covered with, photoresist. Next the photoresist is removed from the top surface 14 of body 11 by exposure to organic solvents or various commercial mixes (e.g. sulfuric acid/hydrogen peroxide) for removing photoresist. Thereafter, the lead is removed from all remaining exposed surfaces by a quick dip of body 11 into nitric acid, which removes the lead by etching. Having removed the unwanted lead layer, next the photoresist is removed from bores 12 by a second, longer, exposure to the appropriate solvent or commercial preparation.

A minimum time period of one hour is required at a temperature of 400°±25° C. to generate a conductive lead film 17. The use of significantly higher temperatures to reduce this annealing time is not beneficial, because of the increased evaporation of lead from the glass body. Annealing at lower temperatures requires too long a time period.

The lead oxide-to-lead transition capability is of particular value in that lead oxide has a relatively low dissociation energy compared to other glass formers so that the hydrogen reduction can be accomplished at a relatively low temperature. Further, lead has a relatively low vapor pressure so that the metallic lead that is formed does not evaporate from the glass surface. In addition, unlike many other glass formers, such as sodium, potassium, or calcium, lead is a relatively inert material and as a consequence the thin film of lead forming on the surface of the glass does not react with the ambient air or with the electroplating solution employed during subsequent processing. Representative glasses containing lead oxide are set forth in TABLE I.

TABLE I

| Corning Glass Code No. | Composition (wt %) | | | | |
|---|---|---|---|---|---|
| 0010 | 63 SiO$_2$, | 1 Al$_2$O$_3$, | 7 Na$_2$O, | 7 K$_2$O, | 22 PbO |
| 0120 | 56 SiO$_2$, | 2 Al$_2$O$_3$, | 4 Na$_2$O, | 9 K$_2$O, | 29 PbO |
| 1990 | 41 SiO$_2$, | 2 Li$_2$O, | 5 Na$_2$O, | 12 K$_2$O, | 40 PbO |
| 7570 | 3 SiO$_2$, | 11 Al$_2$O$_3$, | 11 B$_2$O$_3$, | | 75 PbO |
| 8161 | *40 SiO$_2$, | | 5 Na$_2$O, | | 51 PbO |
| 8160 | **56 SiO$_2$, | 2 Al$_2$O$_3$, | 3 Li$_2$O, | 10 Na$_2$O, | 23 PbO |
| 8871 | 42 SiO$_2$, | 1 B$_2$O$_3$, | 2 Li$_2$O, | 6 Na$_2$O, | 49 PbO |

*4 wt % miscellaneous oxides
**6 wt % miscellaneous oxides

Bores, or holes, 12 are the interior longitudinally-extending cylindrical cavities shown having inner bore surfaces 13. As used herein, unless otherwise specified, the term "cylindrical" is used to described the surface traced by a straight line moving parallel to a fixed straight line and intersecting a circle in a plane perpendicular to the fixed line. When introducing holes by laser drilling with length-to-diameter ratios greater than 20, the walls of the hole tend to have some taper with the entrance diameter of the hole being slightly larger than the exit diameter thereof. For purposes of the description herein, however, the axis of each bore is considered to be substantially parallel to the inner bore surface 13.

Bores 12 may have an aspect ratio in the range of from about 6:1 to about 50:1. When these bores are prepared by laser drilling, the aspect ratios at the higher end of this range require very sophisticated optics to enable the careful focusing required. It is expected that as present equipment is improved and made commercially available, the aspect ratio can increase still further. Although the laser does not "drill" the bores in the classical sense of the term, that term will be employed herein to describe the preparation of bores by the use of laser beam equipment.

Initial efforts to laser drill glass were conducted at room temperature and were clearly unsatisfactory due to excessive spalling. It was conjectured that the problem could be the brittle nature of the glass at room temperature. When attempts were made to laser drill the glass while the glass was heated above its softening point, the holes produced were clean and free of ragged edges. Thus, in the preferred practice of this invention wherein the bores 12 are produced by laser drilling the glass is heated to a temperature at or higher than its softening point and maintained above the softening point during the laser drilling. TABLE II provides data on the softening points for glass compositions in TABLE I.

TABLE II

| Corning Glass Code# | Softening Point* | PbO (wt %) |
|---|---|---|
| 0010 | 626° C. | 22% |
| 0120 | 630° C. | 29% |
| 1990 | 500° C. | 40% |
| 7570 | 440° C. | 75% |
| 8161 | 600° C. | 51% |
| 8160 | 632° C. | 23% |
| 8871 | 527° C. | 49% |

*At the softening point, the viscosity of the glass is equal to $10^{7.65}$ poise.

The drilling may proceed by impinging the laser beam on top surface 14 and then proceeding to back surface 16 or, if the glass is transparent to the particular laser, drilling may proceed by impinging the beam on back surface 16 and then drilling to the top surface 14. The latter mode of operation is referred to as reverse laser drilling. The glasses employed in the practice of this invention are transparent to laser beams produced by a laser employing a Nd:YAG head.

One laser successfully employed was an ESI, Inc Model 25 Laser Scribing System modified with a 10 watt (maximum) optoacoustic Q-switched Nd:YAG head, manufactured by U.S. Laser Corporation. The laser was operated in a repetitively Q-switched mode with a focus beam size of about 20 microns, depth of focus of about 250 microns, an individual pulse duration of about 200 nanoseconds and a repetition rate of about 3 KHz. At a power level of about 2 watts, measured independently in a continuously pulsed mode, 10 pulse trains of 5 msec duration separated by a 10 msec delay were used to drill approximately 5 holes per second. If the glass body being drilled is kept at a temperature above its softening point, considerably greater latitude can be exercised in selecting the number of pulses to be employed per hole. At successively lower temperatures, the use of a successively larger number of pulses become necessary in order to avoid ragged edges.

An alternative method of forming bores in a glass body employs photolithography whereby longitudinally-extending channels are etched into the surfaces of thin plates of glass. Thereafter, these thin plates of glass are stacked so that the channels are disposed in opposed pairs with each pair of opposed channels defining a bore. Thereafter the thin plates of glass are fused together and later this unified assembly can be sliced into wafers with through holes. The fusing process can be carried out either at high temperatures (about 1000° C.) where glass will fuse naturally or at lower temperatures (about 350° C.) utilizing field-assisted bonding.

Having carried out the heating in hydrogen of wafer 11 (followed by removal of the thin lead film from all but the inside surface of bores 12), the resulting glass body is shown in FIG. 2 in which the inside surface of each bore 12 presents a thin layer 17 of lead.

Thereafter, glass plate 11 is placed in a chamber that is first evacuated and then back-filled with a plating solution that wets layer 17 and provides the source for the metal to be deposited by electroplating over and adhered to lead layer 17. The evacuation is necessary in order to insure that the plating solution uniformly fills bores 12 and that no gas bubbles block any of the bores. Cathodic contact is made to glass plate 11 and a layer 18 of metal selected from the group consisting of copper, silver, gold, nickel, platinum and tin is electroplated onto the lead-lined internal surfaces of the through holes 12.

In the case of using copper as the metal to cover lead layer 17, the aqueous electroplating solution consists essentially of from about 220 to about 270 grams/liter of hydrated copper sulfate ($CuSO_4.5H_2O$), from about 5 to about 28 grams/liter sulphuric acid ($H_2SO_4$) from about 0.007 to about 0.013 grams/liter of thiourea ($N_2H_4CS$) and from about 0.3 to about 1.0 grams/liter of molasses. The preferred solution consists essentially of about 250 grams/liter $CuSO_4.5H_2O$, 10 grams/liter $H_2SO_4$, 0.008 grams/liter $N_2H_4CS$ and 0.75 grams/liter molasses. It was discovered that baths of the above composition, of the many different compositions tried, resulted in the most satisfactory layers 18 adhered to and covering lead layers 17.

Electroplating solutions applicable in the practice of this invention can be found in the text "Principles of Electroplating and Electroforming" by William Blum and George B. Hogaboom [3rd Edition, McGraw-Hill Book Co., N.Y. (1958)].

The uniformity of the thickness of the electroplated film in the hole is enhanced by causing the plating solution to flow through holes 12 during the plating operation. This can be accomplished by moving glass wafer, or plate, 11 to and fro in the plating solution or by fixturing plate 11 so that a pressure gradient is applied across the plate. Electroplating is continued until the electrical conductivity of the through holes 12 has been made high enough for the specific application.

The minimum thickness of metal layer 18 to be used is related to the diameter of bore 12. This relationship is shown in TABLE III.

TABLE III

| Hole Diameter (mils) | Metal Thickness (mils) |
| --- | --- |
| 1 | $2.5 \times 10^{-2}$ |
| 2 | $1.3 \times 10^{-2}$ |
| 3 | $8.5 \times 10^{-3}$ |
| 4 | $6.4 \times 10^{-3}$ |
| 5 | $5.1 \times 10^{-3}$ |
| 6 | $4.2 \times 10^{-3}$ |
| 7 | $3.6 \times 10^{-3}$ |
| 8 | $3.2 \times 10^{-3}$ |
| 9 | $2.8 \times 10^{-3}$ |
| 10 | $2.5 \times 10^{-3}$ |

TABLE III-continued

It is necessary that metal layer 18 be sufficiently interconnected so that it forms a continuous electrical circuit between faces 14 and 16 of body 11 although complete (i.e. 100%) surface coverage is not required unless solder dipping is to be employed for making connections therethrough as described hereinafter.

As an alternate to using lead as the metal of layer 17, an initial thin metal layer of any of the metals recited for use as layer 18 may be introduced into bore 12 by electroless deposition. When electroless deposition is employed for the deposition of the initial very thin layer, there is no need to limit the composition of the glass to one which contains lead oxide. Thereafter, deposition of layer 18 by electroplating is necessary in order to obtain the necessary thickness of metal over the inside surface of the hole. Use of electroless deposition is limited to bores having aspect ratios in the range of from 6:1 to about 10:1. In the case of holes with aspect ratios greater than 10:1, it is too difficult to insure the deposition of metal layer 18 over the internal surface of the bore along its entire length. The advantage, of course, of utilizing a lead oxide-containing glass and carrying out the lead oxide reduction is that the metal base required for the electroplating step is already at the inner surface of the bore waiting to be reduced by the heating in hydrogen.

Having prepared the structure shown in FIG. 3, its use is exemplified schematically in FIG. 4 as further hereinafter explained. Although only two through connections 18 are shown in the device of FIG. 3, typically there would be a large number of such small diameter conductive paths closely spaced to accommodate a similar large number of regions to which connection is required in one or more chips mounted thereon. Chip constructions such as are described in Ser. No. '957 and Ser. No. '935 illustrate the type of chip, which presents a large number of through connections and, which may need to be accommodated by complementary feed throughs in an insulating body as afforded by this invention.

Thus, after completion of the application of layer 18 within each bore 12, the interconnect of FIG. 4 can be prepared as follows. Chip 21 is properly positioned and then anodically bonded to wafer 11 (as modified in FIG. 3). The anodic bonding is accomplished by the application of a voltage to the temporary assembly. Next, the unified assembly is dipped in molten solder producing solder pins 22, 23 connecting to P junction 24 and N junction 26, respectively of chip 21.

What is claimed is:

1. A body of electrically insulating glass having opposed, spaced major surfaces and at least one bore extending completely therethrough interconnecting said major surface, said bore having a diameter of less than about 10 mils and an average length-to-diameter ratio of from about 6:1 to about 50:1 and having a metal lining, said metal lining being directly bonded to an underlying layer of metal directly bonded to said insulating glass, the metal of said metal lining being selected from the group consisting of copper, silver, gold, nickel, platinum and tin and providing a continuous electrical path between said major surfaces.

2. The body of electrically insulating glass of claim 1 wherein the glass contains lead oxide and the metal of the underlying layer is lead.

3. The body of electrically insulating glass of claim 2 wherein the glass is a lead-alkali-silicate glass having about 18–65 wt% lead oxide.

4. The body of electrically insulating glass of claim 3 wherein the metal of the metal lining is copper.

5. The body of electrically insulating glass of claim 1 wherein at least one semiconductor chip is bonded to a major surface of said body, said chip being electrically connected to solder pins, each such solder pin filling a copper-lined bore and providing electrical conductivity through said body.

6. The body of electrically insulating glass of claim 5 wherein the bore in which the copper lining is located has a diameter of less than about 1.5 mils.

7. The body of electrically insulating glass of claim 5 wherein the chip is a silicon chip.

8. The body of electrically insulating glass of claim 1 wherein the metal of the metal lining is copper.

9. The body of electrically insulating glass of claim 1 wherein the thickness of said body is in the range of 12 to 500 mils.

* * * * *